(12) United States Patent
Oh

(10) Patent No.: US 7,042,777 B2
(45) Date of Patent: May 9, 2006

(54) MEMORY DEVICE WITH NON-VARIABLE WRITE LATENCY

(75) Inventor: Jong-Hoon Oh, Chapel Hill, NC (US)

(73) Assignee: Infineon Technologies AG, Munich (DE)

( * ) Notice: Subject to any disclaimer, the term of this patent is extended or adjusted under 35 U.S.C. 154(b) by 135 days.

(21) Appl. No.: 10/766,428

(22) Filed: Jan. 28, 2004

(65) Prior Publication Data
US 2005/0162957 A1 Jul. 28, 2005

(51) Int. Cl.
G06F 12/02 (2006.01)
G11C 7/00 (2006.01)

(52) U.S. Cl. .............. 365/194; 365/193; 365/222; 365/230.06; 365/233

(58) Field of Classification Search ........... 365/194, 365/193, 230.06, 222, 233
See application file for complete search history.

(56) References Cited

U.S. PATENT DOCUMENTS

| | | | |
|---|---|---|---|
| 4,809,233 A * | 2/1989 | Takemae | 365/222 |
| 5,808,958 A | 9/1998 | Vogley et al. | |
| 5,991,851 A * | 11/1999 | Alwais et al. | 711/106 |
| 6,023,177 A | 2/2000 | Kim et al. | |
| 6,266,285 B1 | 7/2001 | Farmwald et al. | |
| 6,314,051 B1 | 11/2001 | Farmwald et al. | |
| 6,330,636 B1 | 12/2001 | Bondurant et al. | |
| 6,381,684 B1 | 4/2002 | Hronik et al. | |
| 6,513,089 B1 | 1/2003 | Hofmann et al. | |
| 6,567,338 B1 | 5/2003 | Mick | |
| 6,570,814 B1 | 5/2003 | Farmwald et al. | |
| 6,859,415 B1 * | 2/2005 | Takatsuka et al. | 365/233.5 |
| 6,903,990 B1 * | 6/2005 | Mizugaki | 365/222 |

FOREIGN PATENT DOCUMENTS

JP 40438538 A * 5/1992

* cited by examiner

Primary Examiner—Viet Q. Nguyen
(74) Attorney, Agent, or Firm—Dicke, Billing & Czaja, PLLC

(57) ABSTRACT

One embodiment of the present invention provides a random access memory including a command block and an array of memory cells. The command block is configured to provide a row signal having an active state in response to receiving a write command, wherein the active state occurs at a set time after receipt of the write command, and is configured to provide a write signal having at least a first active state, wherein the first active state of the write signal occurs at a set delay after the active state of the row signal. The array of memory cells is arranged in a plurality of rows and columns, wherein a selected row is opened for access in response to the active state of the row signal, and wherein data is written to at least one memory cell in the opened row in response to the at least first active state of the write signal.

20 Claims, 7 Drawing Sheets

MEMORY DEVICE WITH NON-VARIABLE WRITE LATENCY

BACKGROUND

Some memory systems produce variable latencies, or delays, in the time required for the memory system to make data available to or to receive data from an external device in response to a read or write command. An example of such a memory system is a pseudo-static random access memory (PSRAM) device, which utilizes a self-refresh scheme to maintain the proper status of data stored therein.

In a PSRAM system, if a read or write command is received while a self-refresh operation is in progress, the refresh operation must be completed before the system can perform its data output or data input functions. As a result, the time required for the PSRAM to receive data from the external device in response to a write command, for instance, will vary depending on whether the write command was received while a refresh operation was in progress. Delays incurred as a result of waiting for on-going refresh operations to be completed increase the PSRAM's response time and thus, decrease system bandwidth.

Additionally, because of this variable latency, PSRAM systems must employ a so-called "wait" signal to indicate to an external device accessing the memory system when valid data is present on a memory system data bus (DQ bus) during a read operation and when the memory system is ready to accept data during a write operation. The external device samples the status of the wait signal to synchronize data transfers with the PSRAM. Unfortunately, at high system clock frequencies, this sampling and synchronization process can consume multiple clock cycles, thereby decreasing system performance. Furthermore, if the external device is unable to sample the wait signal within a time allowed by PSRAM operating characteristics, synchronization may fail to be achieved between the external device and the PSRAM, resulting in data errors.

SUMMARY

One embodiment of the present invention provides a random access memory including a command block and an array of memory cells. The command block is configured to provide a row signal having an active state in response to receiving a write command, wherein the active state occurs at a set time after receipt of the write command, and is configured to provide a write signal having at least a first active state, wherein the first active state of the write signal occurs at a set delay after the active state of the row signal. The array of memory cells is arranged in a plurality of rows and columns, wherein a selected row is opened for access in response to the active state of the row signal, and wherein data is written to at least one memory cell in the opened row in response to the at least first active state of the write signal.

DETAILED DESCRIPTION

In the following Detailed Description, reference is made to the accompanying drawings which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
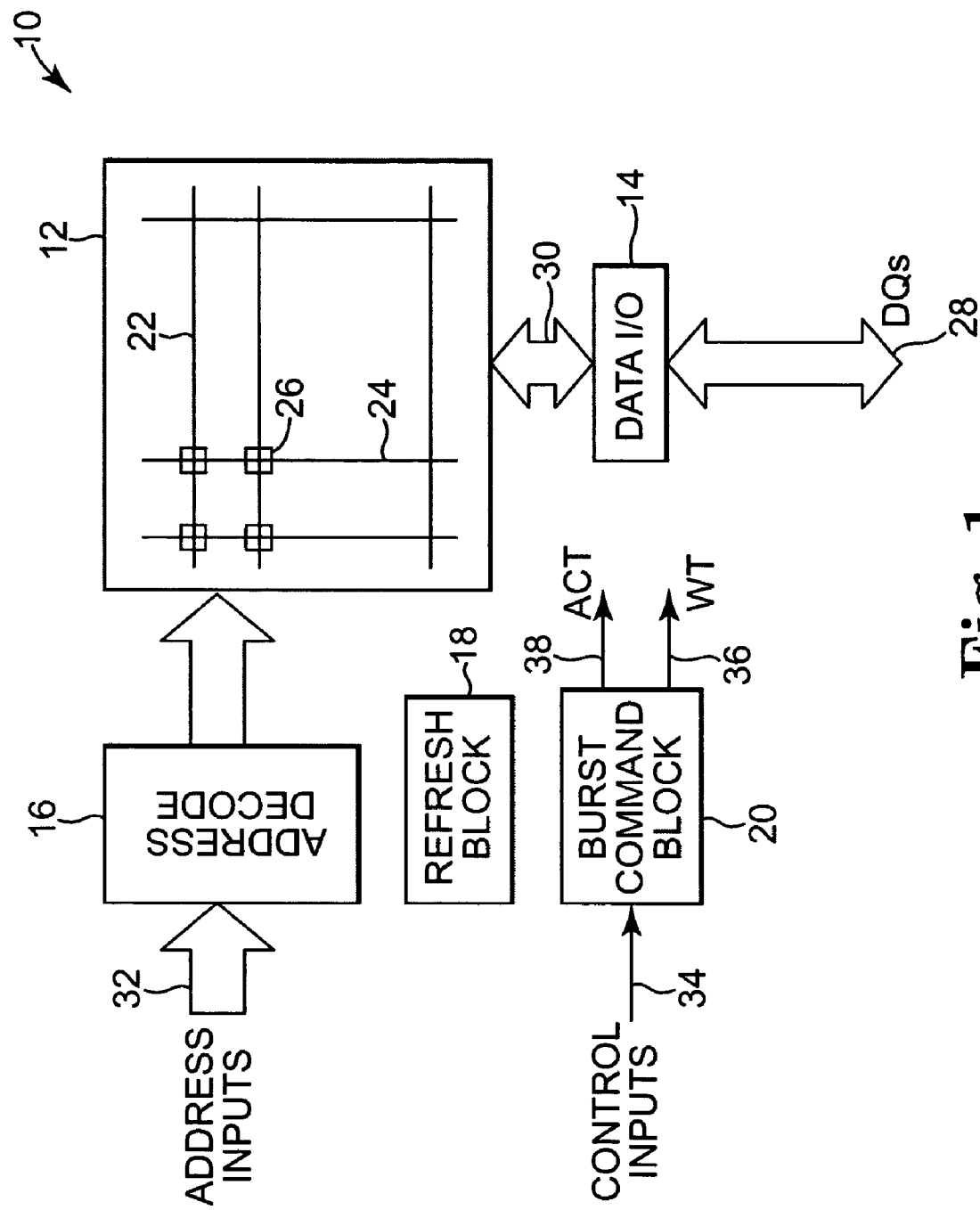
FIG. 1 is a block diagram illustrating generally a random access memory having a command block according to the present invention.

FIG. 1 is a block diagram illustrating generally one embodiment of a memory device 10 according to the present invention. In one embodiment, memory device 10 is a random access memory device (RAM), and in one preferred embodiment is a pseudo-static random access memory device (PSRAM). PSRAM 10 includes a memory array 12, a data input/output (I/O) block 14, an address decode block 16, a self-refresh block 18, and a burst command block 20. Conductive wordlines 22, sometimes referred to as row select lines, extend in the x-direction across memory array 12, and conductive bit lines 24, sometimes referred to as column select lines, extend in the y-direction. A memory cell 26 is located at each wordline 22 and bitline 24 intersection. Refresh block 18 autonomously performs periodic self-refresh operations of memory cells 26 of memory array 12 to maintain the proper status of data stored therein without requiring refresh commands from an external device.

Data I/O block 16 includes input/output circuitry and terminals, or pins (DQ) 28, that form a data bus 30 for transferring data between selected memory cells 26 of memory array 12 and an external device. Address decode block 18 couples selected memory cells 26 to data bus 30 via a corresponding bit lines 24 based on address signals received from an external device via address inputs 32.

Burst command block 20 is configured to receive a write command from the external device via a control input line 34 and, in response, to provide a row activation signal 38 having an active state occurring at a set time after receipt of the write command. Burst command block 20 is further configured to provide a write signal having at least a first active state, wherein the first active state of the write signal occurs at a set delay after the active state of the row activation signal. In one embodiment, refresh block 18 and memory array 12 are configured to perform a refresh operation of selected memory cells 26 of memory array 12 at least within the set time before command block 20 provides the active state of the row activation signal 38 after receipt of the write command. Thus, burst command block 20 provides the at least first active state of the write signal at a same time after receipt of the write command regardless of whether refresh block 18 is performing an on-going refresh operation of memory array 12 when the write command is received.

In one embodiment, burst command block 20 provides a write signal 36 having a series of active states in response to receiving the write command, wherein the first active state of the series occurs at the set delay after the active state of the row activation signal 38. In response to each active state of the series of write signal 36, data is written to a series of selected memory cells 26 of memory array 12 via corresponding bit lines 24 and data bus 30.

By providing the first active state of the write signal at a same time after receipt of the write command regardless of whether a refresh operation is on-going when the write command is received, burst command block 20 provides PSRAM 10 with a fixed latency for write operations. Because PSRAM 10 is able to receive data from an external device at a fixed time after the external device asserts a write command, PSRAM 10 is not required to provide a wait signal during a write operation. As a result, the external device is not required to monitor the status of a wait signal during a write operation, thereby eliminating potential synchronization errors associated with monitoring of the wait signal by the external device and enabling the system to operate at a higher clock frequency and higher bandwidth.

Figure 2:
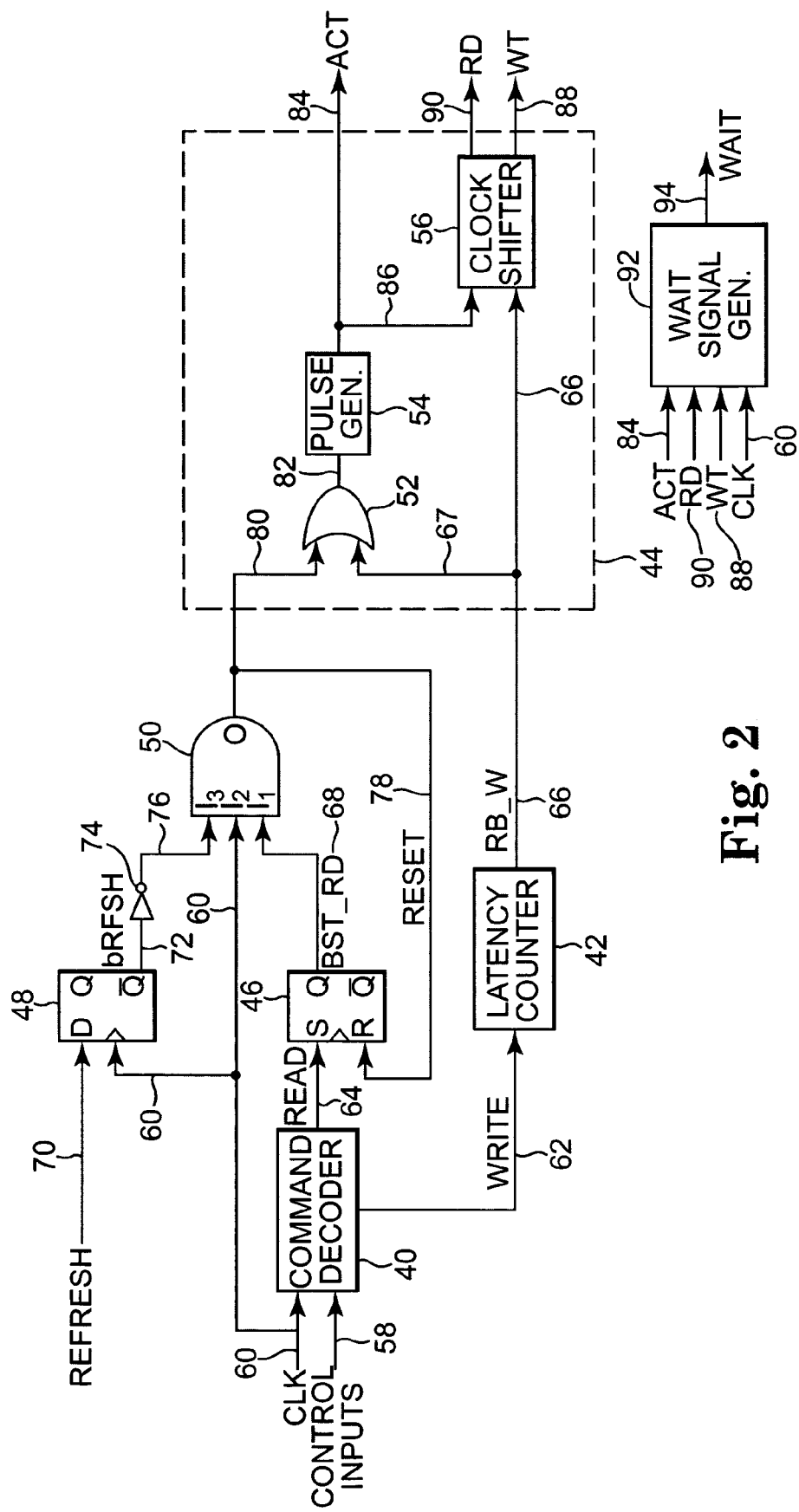
FIG. 2 is a block and schematic diagram illustrating one exemplary embodiment of a burst command block according to the present invention.

FIG. 2 is a block and schematic diagram illustrating one embodiment of a burst enable block 20 according to the present invention having a fixed write latency and a variable read latency. Bust enable block 20 includes a command decoder 40, a latency counter 42, a signal block 44, an SR flip-flop 46, a D flip-flop 48, and AND-gate 50, with signal block 44 further including an OR-gate 52, a pulse generator 54, and a clock shifter 56. Command decoder 40 receives control inputs via a line 58 and a clock signal (CLK) at 60. In response to receiving a write command from an external device via line 58, command decoder 40 provides a write indicator signal having a "high" state via a line 62. In response to receiving a read command via line 58, command decoder 40 provides a read indicator signal having a "high" state via a line 64.

Latency counter 42 receives the write indicator signal via line 62. In response to the write indicator signal having a "high" state, latency counter 42, after a desired delay, provides a delayed write indicator signal having a "high" state via a line 66. Latency counter 42 functions to synchronize memory device 10 with an external device from which data is to be received during a write operation. In one embodiment, the desired delay of latency counter 42 is programmable by the external device. In one embodiment, the latency counter provides a desired delay of two cycles of the CLK signal.

SR flip-flop 46 receives the read indicator signal from command decoder 40 at its "S" input via line 64. In response to the read indicator signal at line 64 having a "high" state, SR flip-flop 46 sets its "Q" output to a "high" state at line 68. D flip-flop 48 receives a refresh signal at its "D" input via a line 70, wherein the refresh signal is indicative of whether there is an on-going self-refresh operation of memory array 12. In one embodiment, as illustrated by FIG. 2, the refresh signal has a "high" state when a self-refresh operation has been completed (i.e., no on-going refresh operation).

D flip-flop 48 provides a bar refresh (bRFSH) signal at its Q' output as indicated at 72, with a "low" state of the bRFSH signal indicating that a self-refresh operation of memory array 12 is not taking place. AND-gate 50 is coupled to the Q output of SR flip-flop 46 via line 68 at a first input, receives the CLK signal at 60 at a second input, and is coupled to the Q' output of D flip-flop 48 via an inverter 74 and a line 76 at a third input. The output of AND-gate is coupled to the "R" input (Reset) of SR flip-flop 46 via a path 78.

OR-gate 52 receives the delayed write indicator signal at 66 from latency counter 42 at a first input via a path 67, and is coupled at a second input to the output of AND-gate 50 via a path 80. Pulse generator 54 is coupled to the output of OR-gate 52 via a path 82 and provides a row active (ACT) signal via a path 84. Pulse generator 54 provides the ACT signal having a pulse with a "high" state in response to the output of OR-gate 52 having a high state, which causes a selected wordline 22 or row of memory cells 26 of memory array 12 to be activated (or opened) for read or write access by an external device.

Clock shifter 56 receives delayed write indicator signal at 66 and the ACT signal via a path 86. In response to receiving the ACT signal pulse, clock shifter 56 waits for a desired number of CLK cycles, and provides a write (WT) signal at 88 if the delayed write indicator signal has a "high" state and provides and provides a read (RD) signal at 90 if the delayed write indicator signal has a "low" state. In one embodiment, the number of desired clock cycles clock shifter 56 waits before providing either WT signal 88 or RD signal 90 is selectable, and in one preferred embodiment the desired number of clock cycles is one.

In one embodiment, the WT signal is a burst WT signal having a series of pulses having a "high" state, wherein the first pulse occurs at a fixed time after receipt of the write command by command decoder 40 via line 58. In one embodiment, the number of pulses in the series provided by clock shifter 56 is based on a burst length. In one embodiment, the burst length is selectable. In response to each pulse of the series, data is written from an external device via data bus 30 and bitlines 24 to a selected series of memory cells 26.

In one embodiment, burst command block 20 further includes a wait signal generator 92 that generates a wait signal 94 based on CLK signal 60, the ACT signal at 84, the WT signal at 88, and the RD signal at 90. The wait signal at 90 has an active state indicating to an external device when a refresh operation of memory array 12 is in progress.

Figure 3:
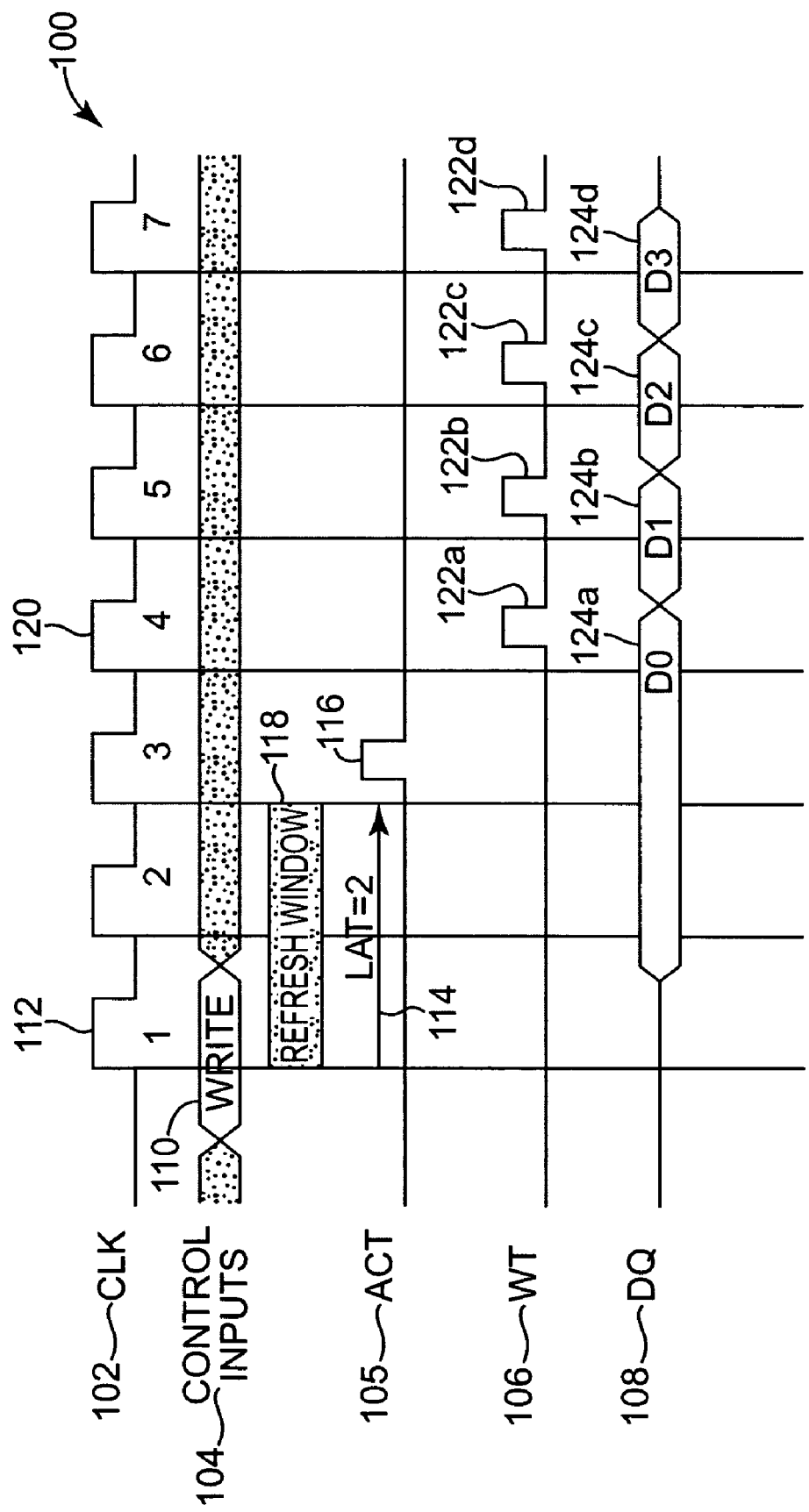
FIG. 3 is a timing diagram illustrating an example operation of the command block of FIG. 2.

FIG. 3 is a timing diagram 100 illustrating an example operation of burst enable block 20 of FIG. 2 in response to a write command. As illustrated, latency counter 42 is programmed with a latency of two. The system clock signal (CLK) is illustrated by waveform 102, control inputs received by command decoder 40 via line 58 are illustrated at 104, the row active signal provided at 84 by pulse generator 54 is illustrated by the waveform at 105, the burst write signal (WT) provided by clock shifter 56 at 88 is illustrated by the waveform at 106, and data blocks placed on the DQ pins 28 by an external device are illustrated at 108.

In response to receiving a write command 110 upon a first clock cycle 112, command decoder 40 provides a write indicator signal having a "high" state to latency counter 42 via path 62. As described above, latency counter 40 as illustrated by FIG. 2 has a selected latency of two clock cycles. Thus, latency counter 40 waits for a latency period 114 of two clock cycles before providing a delayed write indicator signal (not shown in FIG. 3) having a high state to OR-gate 52 via path 66. In addition to providing synchronization with the external device, latency period 114 provides a refresh window 116, wherein a refresh operation of memory array 12 is performed by refresh block 18. Thus, memory device 10 as illustrated by FIG. 3 is configured to perform a refresh operation within the two clock cycles of refresh window 116.

With the delayed write indicator signal at 66 having a "high" state, the output of OR-gate 52 is set "high." In response to the output of OR-gate 52 being set "high", pulse generator 54 provides a pulse 118 having a "high" state. As illustrated by FIG. 3, clock shifter 56 has a selected delay of one clock cycle and a selected burst length of four. Thus, in response to pulse 116 of ACT signal 104 and the delayed write signal indicator at 66 having a "high" state, clock shifter 56, beginning with the next clock cycle 120, provides a series of four write pulses 122a through 122d.

Since a refresh operation is completed within the latency period 114, the first write pulse 122a occurs three cycles of system clock 102 after receipt of write command 110, clock cycle 120 as illustrated, regardless of whether a refresh operation is on-going when write command 110 is received. Because PSRAM 10 is able to receive data from an external device at a fixed time after the external device asserts a write command, PSRAM 10 is not required to provide a wait signal during a write operation. As a result, the external device is not required to monitor the status of a wait signal during a write operation, thereby eliminating potential synchronization errors associated with monitoring of the wait signal by the external device and enabling the system to operate at a higher clock frequency and higher bandwidth.

Figure 4A:
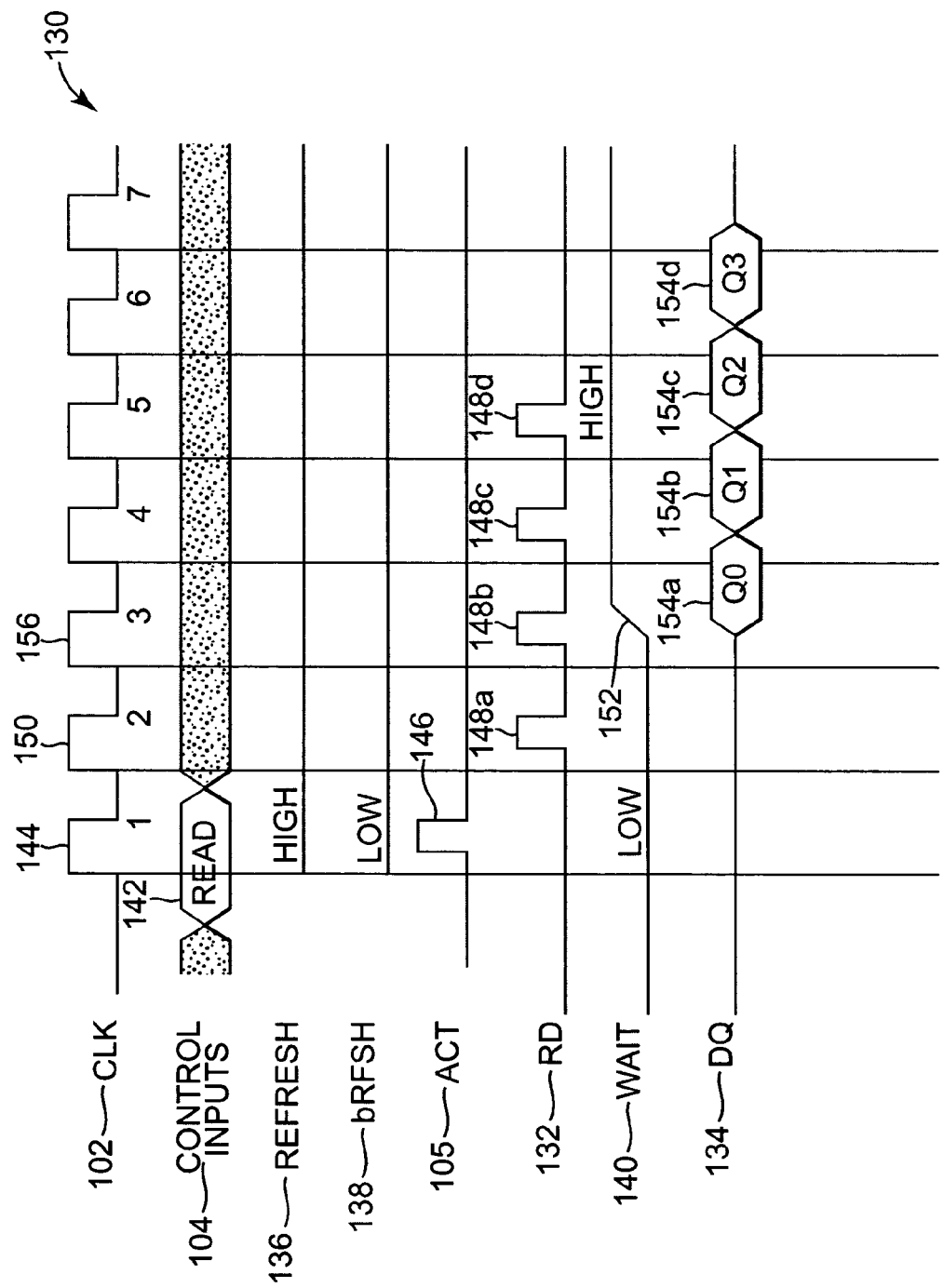
FIG. 4A is a timing diagram illustrating an example operation of the command block of FIG. 2.

FIG. 4A is a timing diagram 130 illustrating an example operation of burst enable block 20 of FIG. 2 in response to a read command received when a refresh operation of memory array 12 is not in progress. As illustrated, latency counter 42 is programmed with a latency of two. The system clock signal (CLK) is illustrated by waveform 102, control inputs received by command decoder 40 via line 58 are illustrated at 104, the row active signal provided at 84 by pulse generator 54 is illustrated by the waveform at 105, the burst read signal (RD) provided by clock shifter 56 at 88 is illustrated by the waveform at 132, and data blocks placed on the DQ pins 28 by memory device 10 are illustrated at 134. The refresh signal received by D flip-flop 48 and the bar refresh signal provided by D flip-flop 48 are illustrated respectively at 136 and 138, and the wait signal 94 provided by wait signal generator 92 is illustrated at 140.

In response to receiving a read command 142 at a first clock cycle 144, command decoder 40 sets the read indicator signal at the "S" input of SR flip-flop 46 "high" and the write indicator signal at 62 "low". With the write indicator signal at 62 "low", the delayed write indicator signal at 66 is also "low". With read indicator signal at 64 set "high", SR flip flop 46 to set its "Q" output "high". At the first clock cycle 144, the refresh signal is "high" (indicating that there is no on-going refresh) and thus the bRFSH is "low" causing the output of inverter 74 to be "high". Thus, at the first clock cycle 144, each of the inputs to AND-gate 50 is "high", resulting in the output of AND-gate 50 being set "high, which in turn causes the output of OR-gate 52 to be set "high".

In response to the output of OR-gate 52 being set "high", pulse generator 54 provides ACT signal having a pulse having a "high" state at 146. As illustrated by FIG. 4A, clock shifter 56 has a selected delay of one clock cycle and a selected burst length of four. Thus, with the delayed write indicator signal at 66 "low" and in response to pulse 146, clock shifter 56 provides a series of four read pulses 148a through 148d beginning at the second clock cycle 150. The wait signal then transitions from low-to-high as indicated at 152, and data blocks 154a through 154d are subsequently placed on DQ pins 28 by memory device 10, beginning at the third clock cycle 156.

Figure 4B:
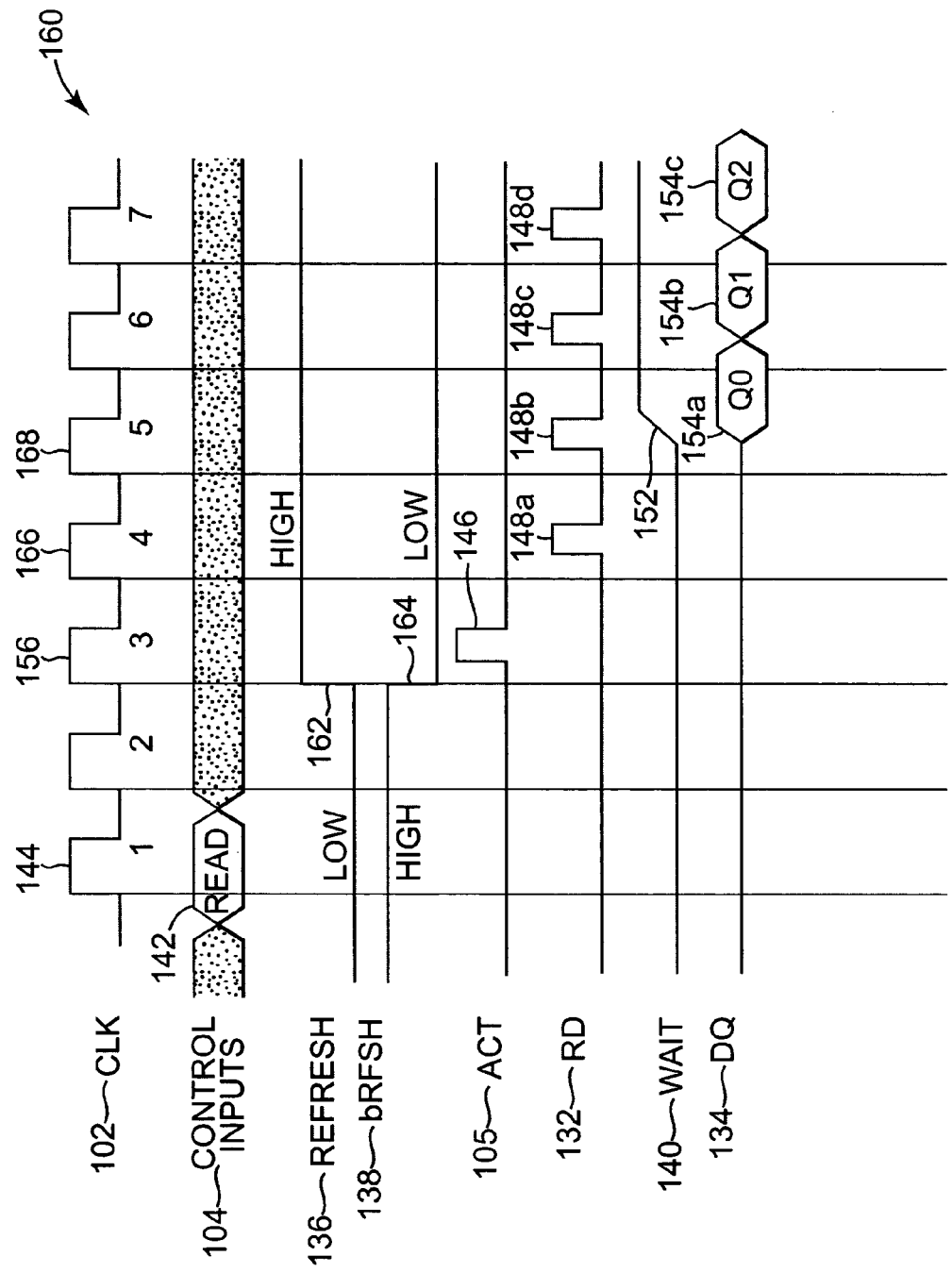
FIG. 4B is a timing diagram illustrating an example operation of the command block of FIG. 2.

FIG. 4B is a timing diagram 160 illustrating an example operation of burst enable block 20 of FIG. 2 in response to a read command received when a refresh operation of memory array 12 is not in progress. This scenario is similar to that illustrated by FIG. 4B, except that the output signals of burst enable block 20 are delayed until the refresh signal transitions from low-to-high upon completion of the refresh operation as indicated at 162, causing the bRFSH signal to transition from high-to-low as indicated at 164. Thus, pulse 116 does not occur until the third clock cycle 156, the read signal pulses 148a through 148d do not begin until the fourth clock cycle 166, and the transition of the wait signal from low-to-high and the subsequent placement of data blocks 154a through 154d on DQ pins 28 does not take place until the fifth clock cycle 168.

Figure 5:
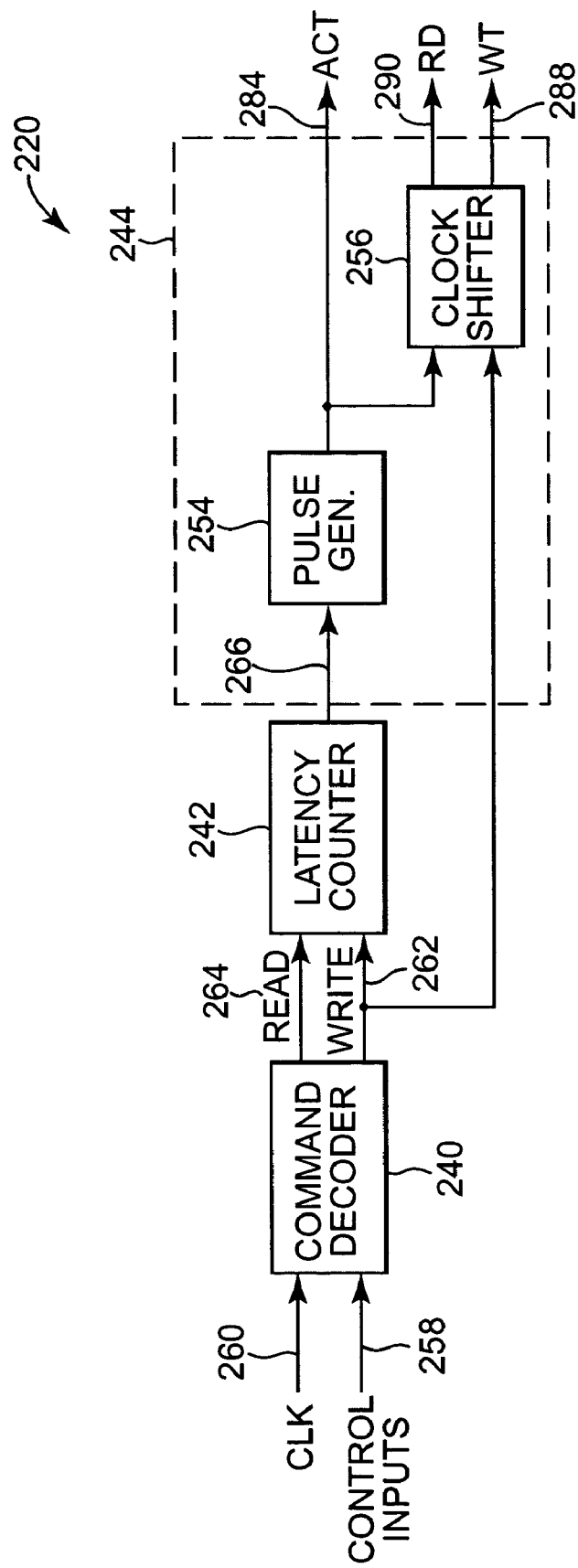
FIG. 5 is a block diagram illustrating one exemplary embodiment of a burst command block according to the present invention.

FIG. 5 is a is a block diagram illustrating one embodiment of a burst enable block 220 according to the present invention having both a fixed write latency and a fixed read latency. Bust enable block 220 includes a command decoder 40, a latency counter 242, and a signal block 244, with signal block 244 further including a pulse generator 254, and a clock shifter 256. Command decoder 240 receives control inputs via a line 258 and a clock signal (CLK) at 260.

In response to receiving a write command from an external device via line 258, command decoder 240 provides a write indicator signal having a "high" state via a line 262, and in response to receiving a read command via line 258 provides a read indicator signal having a "high" state via a line 264. Latency counter 242 receives the write indicator signal via line 262 and the read indicator signal via path 264. In response to either the read or write indicator signal having a "high" state, latency counter 242, after a desired delay, provides a pulse activation signal having a "high" state at 266.

In response to the pulse activation signal having a "high" state, pulse generator 254 provides a row active (ACT) signal 284 having a pulse with a "high" state, which causes a selected wordline 22 or row of memory cells 26 of memory array 12 to be activated (or opened) for a read or write access by an external device. In response to the ACT signal pulse, clock shifter 256 waits for a desired number of cycles of CLK and provides a write signal (WT) at 288 if the write indicator signal has a "high" state and provides a read signal (RD) at 290 if the write indicator signal has a "low" state.

In one embodiment, the WT and RD signals are burst signals having a series of pulses having a "high" state, where the first pulse of the series occurs at a set time after receipt of the corresponding write or read command by command decoder 240 via line 258. In one embodiment, the number of pulses in the series provided by clock shifter 256 is based on a selectable burst length. In response to each pulse of the series, data is written to or read from a selected series of memory cells 26 via bitlines 24 and data bus 30 by an external device.

Figure 6:
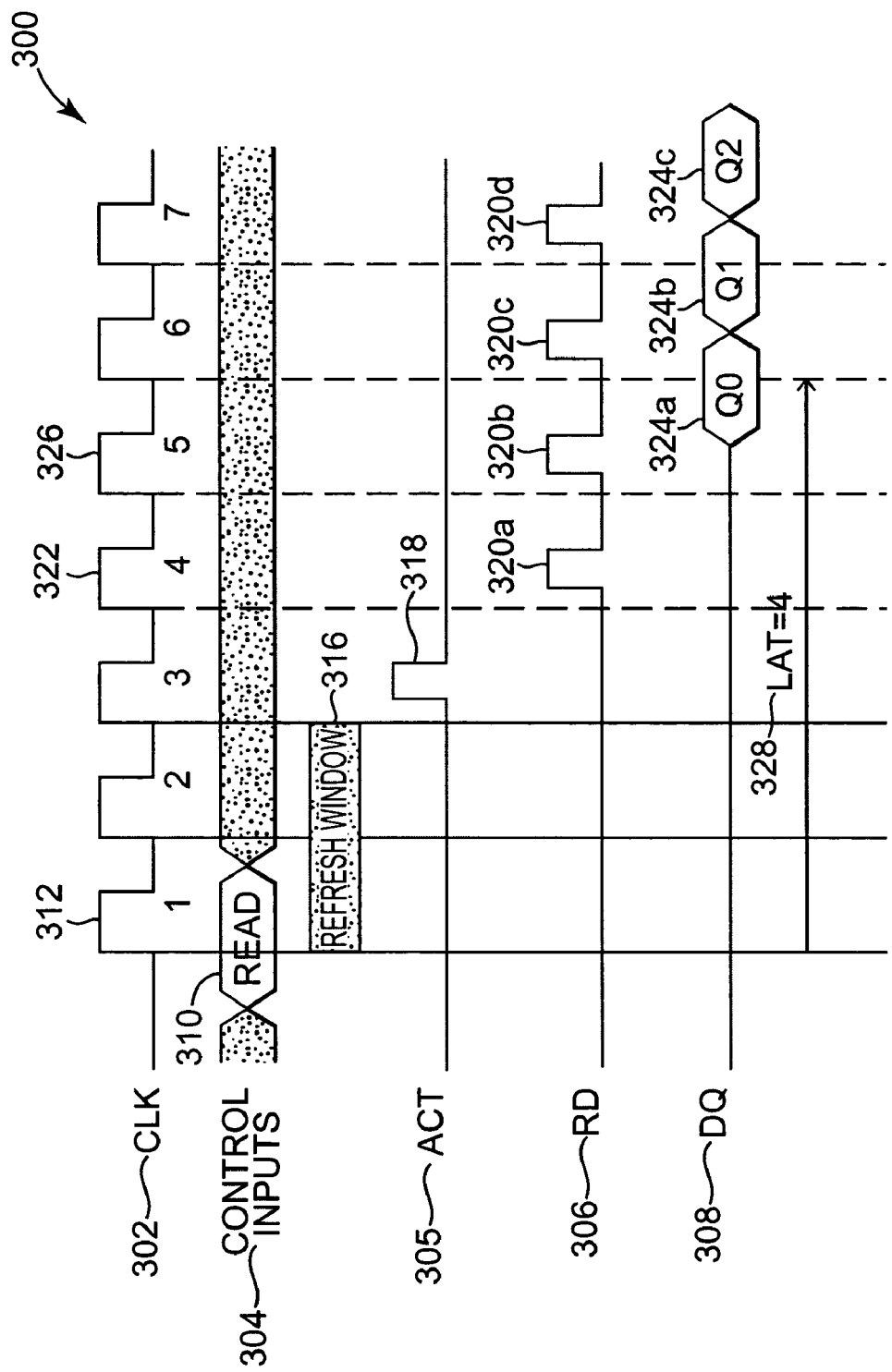
FIG. 6 is a timing diagram illustrating an example operation of the command block of FIG. 5.

FIG. 6 is a timing diagram 300 illustrating an example operation of burst enable block 220 of FIG. 5 in response to a read command. As illustrated, latency counter 242 has a selected latency of two cycles of the system clock at 260 and clock shifter 256 has a selected delay of one clock cycle of the system clock and a selected burst length of four. The response of burst enable block 220 to a write command is the same as the response of the burst enable block 20 of FIG. 2 as illustrated by timing diagram 100 of FIG. 3.

The system clock signal (CLK) is illustrated by waveform 302, control inputs received by command decoder 240 via line 258 are illustrated at 304, the row active signal (ACT) provided at 284 by pulse generator 254 is illustrated by waveform 305, the burst read signal (RD) provided by clock shifter 256 at 290 is illustrated by the waveform at 306, and data blocks placed on the DQ pins 28 by memory device 10 are illustrated at 308.

In response to receiving a read command 310 upon a first clock cycle 312, command decoder 240 provides a read indicator signal having a "high" state at 264, while the write indicator signal at 262 remains at a "low" state. As described above, latency counter 242 has a selected latency of two clock cycles. Thus, in response to the read indicator signal having a "high" state, latency counter 240 waits for two clock cycles before providing a pulse activation signal at 266 having a "high" state. The two clock cycle delay of latency counter 240 provides a refresh window 316 wherein refresh block 18 may perform a refresh operation of memory array 12. Thus, memory device 10 employing burst enable block 220 as illustrated by FIG. 5 is configured to perform a refresh operation within the two clock cycles of refresh window 316.

In response to the pulse activation signal having a "high" state, pulse generator 254 provides an ACT signal at 284 having a pulse 318 having a "high" state. As described above, clock shifter 256 has a selected delay of one clock cycle of the system clock and a selected burst length of four. Thus, in response to pulse 318, clock shifter 256 provides a series of four read pulses 320a to 320d beginning at the fourth clock cycle 322. Memory device 10 places data blocks 324a to 324d (324d not shown) on DQ pins 28 for reading by an external device beginning with the fifth clock cycle 326.

Thus, in the example operation illustrated by FIG. 6, there is a latency period of four clock cycles, as illustrated at 328, from when read command 310 is received at the first clock cycle 312 to where the first data block 324a is read from DQ pins 28 by an external device. However, as illustrated by the timing diagram of FIG. 3, burst command block 220 produces a latency of two clock cycles for a write command. Thus, a memory device, such as memory device 10, employing burst command block 220 will have a reduced write latency as compared to the read latency. Additionally, since the latency is fixed for both read and write operations, generation and monitoring of a wait signal is not required.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A random access memory (RAM) comprising:
    a command block configured to provide a row signal having an active state in response to receiving a write command, wherein the active state occurs at a set time after receipt of the write command, and configured to provide a write signal having at least a first active state, wherein the first active state of the write signal occurs at a set delay after the active state of the row signal; and
    an array of memory cells arranged in a plurality of rows and columns, wherein a selected row is opened for access in response to the active state of the row signal, and wherein data is written to at least one memory cell in the opened row in response to the at least first active state of the write signal.

2. The RAM of claim 1, further comprising a refresh block configured to perform autonomous refresh operations of memory cells of the array to maintain a proper status of the data stored therein, wherein the refresh block and the array are configured to perform a refresh operation at least within the set time, and wherein the refresh block is configured to provide a refresh signal having a first state when a refresh operation is in progress and a second state when a refresh operation is not in progress.

3. The RAM of claim 2, wherein the command block is configured to receive the refresh signal and to receive a read command and, in response to receiving the read command, is configured to provide the row signal having the active state at a first time when the refresh signal has the first state and to provide the row signal having the active state at a second time when the refresh signal has the second state, and is configured to provide a read signal having at least a first active state, wherein the at least first active state of the read signal occurs at the set delay after the active state of the row signal, and wherein data is read from at least one memory cell in the opened array in response to the at least first active state of the read signal.

4. The RAM of claim 3, wherein the command block is configured to provide read and write signals each having a series of active states, wherein a first active state of the series occurs at the set delay after the active state of the row signal.

5. The RAM of claim 4, wherein a number of active states of the series is selectable.

6. The RAM of claim 1, wherein the set time is selectable.

7. The RAM of claim 3, wherein the command block comprises:
    a command decoder configured to receive a system clock and configured to provide a write indicator signal having an active state in response to the write command and to provide a first a read indicator signal having an active state in response to the read command;
    a latency counter configured to provide a delayed write indicator signal having an active state after a first time delay in response the write indicator signal having the active state; and
    a signal block configured to provide the row signal having the active state in response to the delayed write indicator signal having the active state and, after a second time delay, configured to provide the write signal having the at least first active state.

8. The RAM of claim 7, wherein the first time delay and second time delay are each a selectable number of clock cycles of the system clock signal.

9. The RAM of claim 7, wherein the command block further comprises:
    an SR flip-flop configured provide a second read indicator signal having an active state at a first output in response to receiving the first read indicator signal having the active state at an S input, and having an R input;
    a D flip-flop configured to provide a bar refresh signal having an active state at an output in response to receiving a refresh signal having an inactive state at a D input; and
    an AND-gate receiving the bar refresh signal via an inverter at a first input, the clock signal at a second input, and the second read indicator signal at a third input, and providing at an output a third read indicator signal to the signal block and the R input of the SR flip-flop.

10. The RAM of claim 9, wherein the signal block is configured to provide the row signal having the active state in response to the third read indicator signal having an active state and, after the second time delay, to provide the read signal having the at least first active state.

11. The RAM of claim 10, wherein the signal block further comprises:
   an OR-gate receiving the third read indicator signal at a first input and the delayed write indicator signal at a second output, and providing a row indicator signal having an active state at an output when third read indicator signal has the active state or the delayed write indicator signal has the active state;
   a pulse generator configured to provide the row signal having an active state in response to the row indicator signal having the active state; and
   a clock shifter, in response to the row signal having the active state, configured to provide after the second time delay the write signal when the delayed write indicator signal has the active state and the read signal when the delayed write indicator signal has an inactive state.

12. The RAM of claim 1, wherein the command block is further configured to provide the row signal having the active state at the set time in response to receiving a read command, and to provide a read signal having at least a first active state, wherein the first active state of the read signal occurs at the set delay after the active state of the row signal, and wherein data is read from at least one memory cell in the opened array in response to the first active state of the read signal.

13. The RAM of claim 12, wherein the command block is configured to provide read and write signals each having a series of active states, wherein a first active state of the series occurs at the set delay after the active state of the row signal.

14. The RAM of claim 12, wherein the command block further comprises:
   a command decoder configured to receive a system clock and configured to provide a write indicator signal having an active state in response to the write command and to provide a read indicator signal having an active state in response to the read command;
   a latency counter configured to provide a pulse signal having an active state after a first time delay in response to either the write indicator signal or the read indicator signal having the active state; and
   a signal block configured to receive the write indicator signal and to provide the row signal having the active state in response to the pulse signal having the active state and, after a second time delay, configured to provide the write signal having the at least first active state when the write signal has the active state and to provide the read signal having the at least first active state when the write signal has an inactive state.

15. The RAM of claim 14, wherein the first time delay and second time delay are each a selectable number of clock cycles of the system clock signal.

16. The RAM of claim 14, wherein the signal block further comprises:
   a pulse generator configured to provide the row signal having the active state in response to the pulse signal having the active state; and
   a clock shifter configured to receive the write indicator signal and, after the second time delay, to provide the write signal having the at least first active state when the write signal has the active state and to provide the read signal having the at least first active state when the write signal has an inactive state.

17. A random access memory (RAM) comprising:
   means for providing a row signal having an active state in response to receiving a write command, wherein the active state occurs at a set time after receipt of the write command, and for providing a write signal having at least a first active state occurring at a set delay after the active state of the row signal; and
   an array of memory cells arranged in a plurality of rows and columns, wherein a selected row is opened for access in response to the active state of the row signal, and wherein data is written to at least one memory cell in the opened row in response to the at least first active state of the write signal.

18. The RAM of claim 17, further comprising:
   means for performing autonomous refresh operations of memory cells of the array within the set time and for providing a refresh signal having a first state when a refresh operation is in progress and a second state when a refresh operation is not in progress.

19. The RAM of claim 18, further comprising:
   means for providing, in response receiving a read command, the row signal having the active state at a first time when the refresh signal has the first state and for providing the row signal having the active state at a second time when the refresh signal has the second state; and
   means for providing a read signal having at least a first active state, wherein the at least first active state occurs at the set delay after the 20. The RAM of claim 17, further comprising:
   means for providing the row signal having the active state at the set time in response to a read command; and
   means for providing a read signal having at least a first active state, wherein the first active state of the read signal occurs at the set delay after the active state of the row signal, and wherein data is read from at least one memory cell in the opened array in response to the first active state of the read signal.

* * * * *

UNITED STATES PATENT AND TRADEMARK OFFICE
CERTIFICATE OF CORRECTION

PATENT NO. : 7,042,777 B2 Page 1 of 1
APPLICATION NO. : 10/766428
DATED : May 9, 2006
INVENTOR(S) : Jong-Hoon Oh It is certified that error appears in the above-identified patent and that said Letters Patent is hereby corrected as shown below:

Column 3, line 30, delete "an SR flip-flop" and insert in place thereof --a SR flip-flop--.

Column 4, line 21, delete second occurrence of "and provides".

Column 6, line 19, delete second occurrence of "is a".

Column 10, line 36, Claim 19, delete "in response receiving" and insert in place thereof --in response to receiving--.

Column 10, line 44, Claim 19, after "delay after the" insert the following --active state of the row signal--.

Signed and Sealed this

Twenty-third Day of October, 2007

JON W. DUDAS
*Director of the United States Patent and Trademark Office*